United States Patent [19]
Glass

[11] Patent Number: 6,010,964
[45] Date of Patent: Jan. 4, 2000

[54] WAFER SURFACE TREATMENT METHODS AND SYSTEMS USING ELECTROCAPILLARITY

[75] Inventor: Thomas R. Glass, Idaho City, Id.

[73] Assignee: Micron Technology, Inc., Boise, Id.

[21] Appl. No.: 08/915,157

[22] Filed: Aug. 20, 1997

[51] Int. Cl.$^7$ .................................................. H01L 21/00
[52] U.S. Cl. .................... 438/692; 438/693; 438/747; 438/748; 216/38; 216/88; 216/89; 156/345
[58] Field of Search ..................... 438/691, 692, 438/693, 697, 699, 747, 748; 216/38, 88, 89; 451/36, 41, 285; 156/345 LP

[56] References Cited

U.S. PATENT DOCUMENTS

| | | | |
|---|---|---|---|
| 4,193,226 | 3/1980 | Gill, Jr. et al. | 51/124 R |
| 4,811,522 | 3/1989 | Gill, Jr. | 51/131.1 |
| 5,421,729 | 6/1995 | Kutin | 434/109 |
| 5,533,924 | 7/1996 | Stroupe et al. | 451/286 |
| 5,575,706 | 11/1996 | Tsai et al. | 156/345 |
| 5,637,185 | 6/1997 | Murarka | 438/693 X |

OTHER PUBLICATIONS

M.N. Esmail et al., "Air Entrainment and Dynamic Contact Angles in Hydrodynamics of Liquid Coating", *Canadian J. Chem. Engineer.*, 68, 197–203 (1990).

R. Rillaerts et al., "The Dynamic Contact Angle", *Chem. Engineer. Sci.*, 35, 883–887 (1980).

J.M. Steigerwald et al., "Electrochemical Potential Measurements during the Chemical–Mechanical Polishing of Copper Thin Films", *J. Electrochem. Soc.*, 142, 2379–2385 (1995).

*Primary Examiner*—William Powell
*Attorney, Agent, or Firm*—Mueting, Paasch & Gebhardt, P.A.

[57] ABSTRACT

A surface treatment method for use in integrated circuit fabrication includes providing a substrate assembly having a surface. A liquid is provided adjacent the surface resulting in an interface therebetween. An electrical potential difference is applied across the interface and the surface is treated as the electrical potential difference is applied across the interface. The liquid may be a planarization liquid when the treatment of the surface includes planarizing a substrate assembly or the liquid may be a coating material when the treatment of the surface includes applying a coating material on the surface.

27 Claims, 4 Drawing Sheets

WAFER SURFACE TREATMENT METHODS AND SYSTEMS USING ELECTROCAPILLARITY

FIELD OF THE INVENTION

The present invention relates to methods and systems for use in integrated circuit fabrication. More particularly, the present invention relates to the use of electrocapillarity in the treatment of wafer surfaces, e.g., planarization, coating, etc.

BACKGROUND OF THE INVENTION

In semiconductor wafer processing, various surface treatment steps are commonly performed. For example, such surface treatment may include application of a coating on the wafer surface or planarizing an exposed wafer surface prior to subsequent processing steps.

Planarization, such as chemical-mechanical planarization (CMP), is typically performed to achieve a planar surface over a wafer, sometimes referred to as "global planarity." Typically, the planarization process involves a rotating wafer holder that holds a wafer. A slurry is applied to a rotating table or platen which has a polishing pad thereon. The polishing pad is applied to the wafer at a certain pressure to perform the planarization. In some planarization processes, the wafer holder may not rotate, the table or platen may not rotate and/or the platen may be moved in a linear motion as opposed to rotating. There are numerous types of planarization units available which perform the process in different manners.

In many circumstances, even after planarization has been performed, surface nonuniformities of the wafer are present. For example, because of different rotational speeds of the process at the center of the wafer as opposed to the edge of the wafer and different rotational speeds of the rotating table at the center and at the rotating table's periphery, the rate of removal tends to be different across the wafer surface. For example, the removal rate at the edge of the wafer may be higher than at the center of the wafer. Further, for example, the slurry may not be adequately transported to the entire contact area between the wafer and the pad such that further rate of removal differences are created. Slurry transport to the center of the wafer may also be inadequate when the surface is, or becomes as a result of planarization, substantially planar and further planarization is to be performed. This is because no gaps or nonuniformities are available to assist the transport of the slurry to the middle of the contact area. It is desirable to produce a wafer which is substantially uniformly flat across the wafer surface. Nonuniformity of the wafer surface, even after planarization, may be problematic. For example, such nonuniformity may lead to patterning or photolithography problems. Further, such nonuniformity may result in etching at undesirable depths on the wafer surface.

A wafer handling problem may also occur during wafer processing. For example, in some situations, the wafer can slip out of the holder and stick to the pad on the planarization platen. The wafer is then difficult to remove therefrom.

Other surface treatments, such as coating of wafer surfaces also benefit from surface uniformity. For example, uniform coating of photoresist or other polymer coatings on a wafer may be beneficial to a patterning process performed after such coating is applied. Conventionally, vapor priming is one method that has been used, for example, to minimize the amount of photoresist needed during a patterning process. The vapor prime helps "pre-wet" the semiconductor wafer and allows photoresist to flow out more smoothly, and thus more homogeneously. However, elimination of the need for vapor priming would decrease the number of steps in the patterning process.

For the above reasons, surface treatment methods and systems for performing such surface treatments, e.g., planarization, are needed to provide adequate uniformity of surfaces in wafer processing. The present invention as described below provides such improvements and overcomes the problems described above and those problems which will become apparent to one skilled in the art from the detailed description provided below.

SUMMARY OF THE INVENTION

A surface treatment method for use in integrated circuit fabrication in accordance with the present invention includes providing a substrate assembly having a surface. A liquid is provided adjacent the surface resulting in an interface therebetween. An electrical potential difference is applied across the interface and the surface is treated as the electrical potential difference is applied across the interface.

In one embodiment of the method, the liquid is a planarization liquid and treating of the surface includes planarizing the substrate assembly. In another embodiment of the method, the liquid is a coating material and the treating of the surface includes applying the coating material on the surface. In another embodiment of the method, the electrical potential difference is varied across at least a first portion of the interface relative to a second portion of the interface.

A planarization apparatus in accordance with the present invention includes a planarization element and a holder for supporting a substrate assembly having a surface. The holder is positionable for disposing the substrate assembly supported in the holder relative to the planarization element. A dispensing device provides a liquid planarization composition adjacent the surface resulting in an interface between the liquid planarization composition and the surface. An electrical potential difference is then applied across the interface as the substrate assembly is disposed relative to the planarization element.

A coating apparatus in accordance with the present invention includes a rotatable coating platform for supporting a substrate assembly having a surface and a dispensing device for introducing a liquid coating material at the surface of the substrate assembly resulting in an interface therebetween. An electrical potential difference is applied across the interface.

DETAILED DESCRIPTION OF THE EMBODIMENTS

The present invention shall be described with reference to FIGS. 1–4. As used herein, the term substrate assembly includes wafers and any substrate supported structure, i.e., such as a semiconductor substrate or any other substrate having one or more layers or structures formed thereon. Both terms are to be understood as including silicone-on-sapphire (SOS) technology, silicon-on-insulator (SOI) technology, doped and undoped semiconductors, epitaxial layers of silicon supported by a base semiconductor, as well as any other semiconductor based structures well known to one skilled in the art. Furthermore, when a reference is made to a wafer or a substrate assembly in the following description, previous process steps may have been utilized to form regions/junctions/lines, such as metallization lines, insulative layers, etc., in or on a structure previously formed.

Further as used herein, interfacial tension refers to the tension at the interface between immiscible materials, e.g., a liquid composition and a solid surface. Electrocapillarity refers to the variation in interfacial tension caused by an applied voltage.

Application of an electrical potential difference across the interface of a liquid (e.g., preferably an ionic conductor) at the surface of a solid material (e.g., preferably an electronic conductor), causes a change in the interfacial tension at the liquid/solid interface, i.e., electrocapillarity. As a practical matter, this results in changes in contact angle between the liquid and the solid. The use of the electrical potential difference to alter the interfacial tension, and thus, the wettability, of the liquid contacting the surface of the solid material improves the control of a planarization process as compared to conventional planarization processes. The amount of material needed to complete the planarization process may also be reduced. In addition, by varying the potential across the interface between the liquid and the solid material, the planarization rate can be controlled at desired locations. For example, such control using the adjustment of the electrical potential difference may be used so that a periphery of a wafer is polished at the same rate as the rest of the wafer. Further, the application of the electrical potential difference allows for remediation in the event of "slip-out" during a planarization process, i.e. when the wafer slips out of the wafer holder during processing and adheres to the platen or pad of the planarization apparatus.

Other surface treatment processes, can also be advantageously affected by the application of electrical potential differences across the interface between a liquid and surface of a solid material. For example, such processes may include polishing, grinding, or coating operations, although the present invention has particular pertinence to wafer planarization processes.

In conventional planarization processes, a substrate assembly, e.g., a wafer, may be planarized to prepare it for other processing operations and/or the substrate assembly may be planarized after the deposition of one or more various layers. For example, the wafer may include various surfaces having nonuniformities, such as height differences, during the fabrication of semiconductor devices. Further, the wafer may be comprised of semiconductor materials, such as silicon or germanium and/or the wafer can be a blanket wafer, i.e., a silicon wafer which has been cut from a silicon boule and is being prepared for semiconductor fabrication. Such surfaces may be surfaces of layers comprising insulating, semiconducting, and conducting materials formed during processing. The surfaces may include but are clearly not limited to dielectrics, polysilicon, oxide filled trenches, various metal films (for example, aluminum, copper, titanium, and gold), doped oxides, spin on glasses, nitrides, phosphides, borides, and silicides or any other fabricated surface which may require planarization as is known to one skilled in the art. The wafer can also be patterned, that is, with only some areas having one or more layers formed thereon. Therefore, the present invention is not limited to the planarization of any particular surface, but is limited only in accordance with the invention as described in the accompanying claims.

Planarization is generally performed using a contacting liquid, typically, for example, a slurry containing abrasive particles and a carrier liquid. The slurry is applied to the surface of a semiconductor wafer and the wafer is planarized using a pad to which pressure is applied. Typically, there is a reactive component in the slurry, i.e., the chemical component, which reacts with material it comes into contact with and assists in removing it. The mechanical component of planarization is typically abrasive media present in the slurry.

Figure 1A:
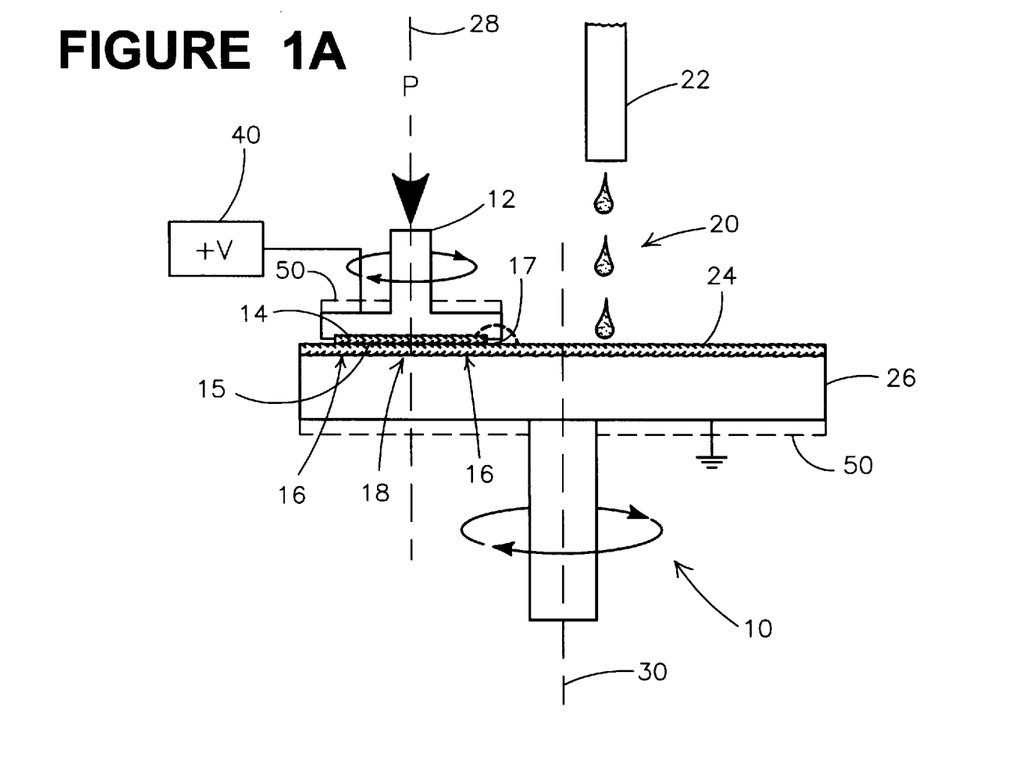
FIG. 1A is an illustrative diagram generally showing a planarization apparatus in accordance with the present invention.

FIG. 1A is a diagrammatical illustration showing one embodiment of a planarization apparatus for planarization of surfaces of semiconductor wafers in accordance with the present invention. As shown in FIG. 1A, the present invention may utilize a planarization assembly 10 such as Model 372 or Model 472 available from IPEC/Westech modified to include the ability to apply an electrical potential difference across the interface between the surface being planarized and the liquid used in the planarization process. Other planarization assemblies or units for performing planarization could also be modified in such a manner, and are readily available and are clearly contemplated by the scope of the present invention as described in the accompanying claims. For example, the planarization process and apparatus described in U.S. Pat. No. 5,421,729, entitled "Apparatus For Planarizing Semiconductor Wafers, and a Polishing Pad for a Planarization Apparatus" and herein incorporated by reference; U.S. Pat. No. 4,193,226 entitled "Polishing Apparatus" and herein incorporated by reference; U.S. Pat. No. 4,811,522 entitled "Counterbalanced Polishing Apparatus" and herein incorporated by reference; and any other planarization assembly as known to those skilled in the art may be so modified. Various other embodiments of planarization assemblies may also be so modified for use with the present invention. For example, some planarization units do not use rotating platens and rotating wafer holders. The present invention is inclusive of all planarization units for which the present invention provides benefit and which can be suitably modified.

The general illustrative planarization assembly 10, as shown in FIG. 1A, for performing planarization, e.g, CMP, in accordance with the present invention, includes a rotating wafer holder 12 that holds wafer 14 having a more peripheral region 16 and a more central region 18. A liquid 20 is provided by a dispensing device 22, e.g, a drip device, a spray device, an injection device, etc., to a polishing pad 24. The polishing pad 24 is located on a rotating table platen 26. The polishing pad 24 is applied to the surface 15 of wafer 14 in the presence of the liquid 20 at a certain pressure to perform the planarization. The pressure applied is represented in FIG. 1A by the arrow marked "P"; this pressure P represents both down force pressure and backside pressure applied per a planarization assembly, such as an assembly available from IPEC/Westech. The rotating elements 12, 26 are rotated and moved by motors or drive means (not shown) as is readily known to those skilled in the art.

Figure 1B:
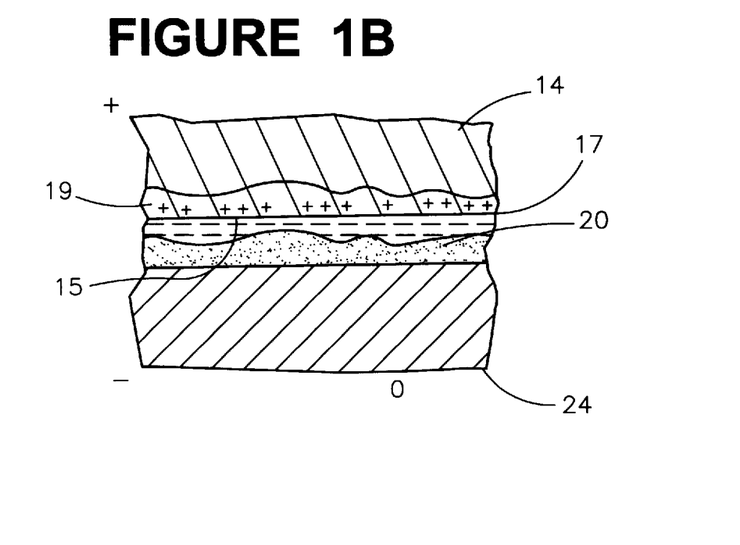
FIG. 1B is a more detail diagram of a portion of FIG. 1A showing an interface between the wafer and liquid shown therein.

The interface 17 between the liquid 20 and wafer 14, i.e., where the liquid 20 and wafer surface 15 contact one another, is shown in more detail in FIG. 1B. The interfacial control of this interface 17 is the point of control using electrocapillarity in accordance with the present invention.

Wafer holder 12 rotates wafer 14 at a selected velocity about an axis 28 and moves wafer 14 under controlled pressure P across pad 24. The area of the pad 24 which is used with the liquid 20 for planarization of the wafer 14 varies as the wafer 14 is moved in a predetermined pattern as is known to those skilled in the art.

The dispensing device 22 introduces the liquid 20 to the pad 24 at a specified flow rate. The liquid 20 may be introduced at various locations about the pad without affecting the benefits of the present invention. For example, the liquid 20 may be introduced from above the pad 24, such as by drip, spray, or other dispensing techniques; may be introduced from beside the rotating table 26 by spraying or other dispensing technique; or, further, for example, the liquid may be introduced through the pad 24 such as performed with the planarization apparatus sold under the trade designation of IPEC Guard available from IPEC.

The rotating table 26 is rotated about axis 30 at a selected velocity and is generally rotated in the same direction as the wafer holder 12. The surface 15 of the wafer 14 is held in juxtaposition relative to the pad 24 so that planarization occurs. Conventionally, the liquid and the pad pressure primarily determine the planarization rate or rate of removal of the surface material.

Generally, the liquid 20 may include a conventional slurry including an abrasive component and a component that chemically interacts with the surface 15. For example, a typical oxide polishing slurry may consist of a colloidal suspension of oxide particles, with an average size of, for example 120 nm, in an alkali solution having a pH greater than or equal to 9. Ceria ($CeO_2$) suspensions may also be used when appropriate, particularly where large amounts of $SiO_2$ must be removed. Ceria acts as both the chemical and mechanical agent in the slurry. Other abrasive components of the slurry component may include, but are not limited to, alumina ($Al_3O_2$), silica, zirconium oxide ($ZnO_2$), titania ($TiO_2$), or any other abrasive used in conventional planarization slurries as is known to one skilled in the art.

Several slurry solutions presently available include ILD1300, an aqueous fumed silica slurry including amorphous silica and ammonium hydroxide, available from Rodel, Inc., Newark, Del., and SC-1, a colloidal fumed silica aqueous slurry including amorphous silicon dioxide, DI water, and potassium hydroxide, available from Cabot Corp. Tuscola, Ill. under the trade designation CAB-O-SPERSE SC-1. General characteristics of suitable conventional slurry components utilized in conjunction with the present invention include that the hardness of the polishing particles or abrasive component should be about the same hardness as the hardness of the film being polished to avoid damaging the film. In addition, the particles should be uniform and the solution free of metallic contaminants. Further, for example, conventional planarization slurries having a pH greater than about 9 are used for oxide polishing processes and those less than a pH of about 4 are used in polishing processes of, for example, tungsten. The type of slurry used is dependant upon the type of surface being polished.

Further, the present invention may also be utilized with planarization assemblies having pads including abrasive components wherein the liquid dispensed by the dispensing device 22 only includes a liquid component that chemically interacts with the surface. Therefore, the slurry including an abrasive component is not needed as the abrasive component of a slurry is provided by the pad that has an abrasive component at a surface thereof. The chemical interacting liquid component however, would still be required. The liquid chemically interacting component may include, for example, ammonium hydroxide or any alkali solution having a pH greater than or equal to 9.

In accordance with the present invention, a voltage source 40 is connected to the planarization apparatus 10 such that an electrical potential difference is applied across the wafer surface 15 and liquid 20 interface, i.e., interface 17. FIG. 1B illustrates the effect of the potential difference at the semiconductor wafer surface. Regions of charge 19 are created by the potential difference across the interface 17 such that the interfacial tension is influenced. As shown in FIGS. 1A–1B, wafer 14 is mounted in a ring (not shown) and supported by a wafer holder 12. Liquid 20 is dispensed such that it flows between the wafer surface 15 and polishing pad 24 mounted on platen 26. In the embodiment of the present invention shown in FIG. 1A, the voltage source 40 is connected to the wafer holder 12 and the platen 26 is grounded to create the electrical potential difference across the wafer surface/liquid interface 17 and inducing the formation of the charged regions 19, shown more clearly in FIG. 1B. Regions 19 of charge are created in both the wafer 14 and the liquid 20. For example, if the wafer 14 is positive with respect to the liquid 20, then a layer of net positive charge forms in the wafer and a layer of net negative charge forms in the liquid 20 as shown in FIG. 1B. In other words, electrons want to flow from the liquid to the solid. However, since the liquid is an ionic conductor, there is no direct mechanism for such flow to occur. Consequently, the negative ions group near the interface 17. In the configuration of FIG. 1A, the polishing platen is conductive as is the wafer holder.

However, it should be recognized that the electrical potential may be applied with one or more electrodes connected to the various elements of the planarization apparatus as is generally shown by the dashed lines 50 of FIG. 1A. Such electrodes may be of numerous and varied configurations. Any configuration which adequately applies a potential difference across the interface 17 is suitable in accordance with the present invention. For example, an electrical potential difference may be provided by attached electrodes to the wafer holder 12 and/or the platen 26, which would alleviate the need for these elements to be conductive.

The voltage source 40 and ground may be any suitable source for creating a potential difference across the interface 17, such as a DC power source providing a constant potential, or an AC power source providing a time varying potential. The electrical potential difference applied across the interface 17 may be in the preferable range of about 0.5 volts to about 5 volts, more preferably about 0.1 volts to about 1 volt. Although in the configurations shown herein, one side of the interface is connected to ground, it is contemplated that one side of the interface may be connected positively to a voltage source and the other connected to a negative voltage source to create the electrical potential difference across the interface 17 as generally represented by the +and − signs in FIG. 1B.

Preferably, the electrical potential difference across the interface 17 is expected to alter the planarization rate by altering the interfacial tension, or wettability, between the wafer surface 15 and the liquid 20.

Figure 2:
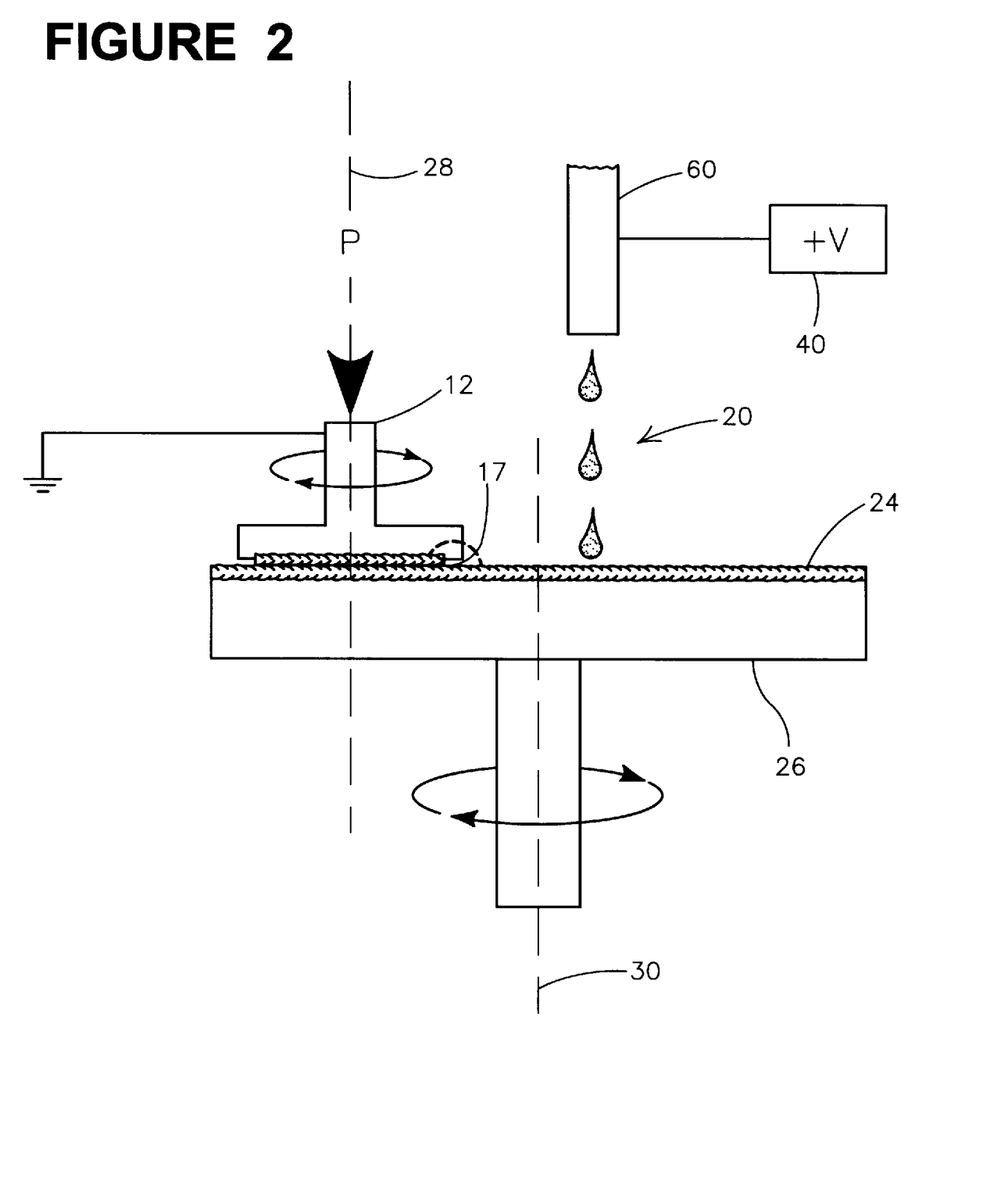
FIG. 2 is an alternative illustrative diagram of a planarization apparatus in accordance with the present invention.

FIG. 2 shows an alternative embodiment of providing the electrical potential difference across the interface 17. The planarization apparatus of FIG. 2 is substantially identical to the apparatus as shown and described in FIG. 1, except that the voltage source 40 is coupled to a dispensing device 60 suitable for providing a charge to the liquid 20 as it is being provided to the pad 24. As such, a potential difference is created between the liquid and the grounded holder 12. For example, the dispensing device may include an electrospraying device having a nozzle which transfers charge to the liquid that the nozzle sprays.

Figure 3:
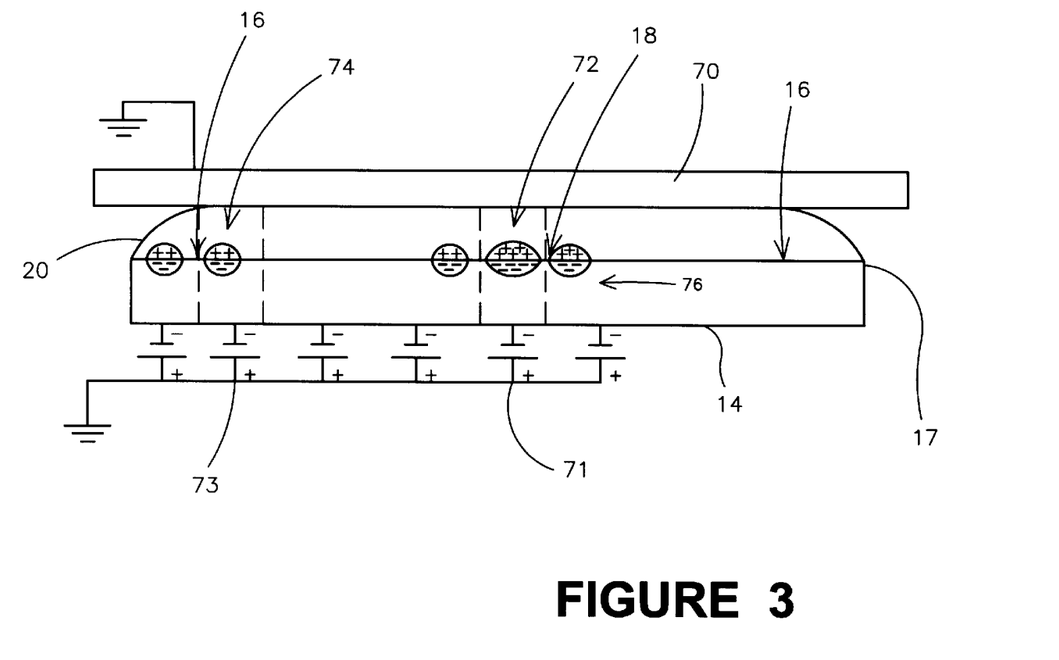
FIG. 3 is an alternative embodiment including varied electrical potential differences for use with a surface treatment apparatus in accordance with the present invention.

FIG. 3 shows a further alternative embodiment according to the present invention. In the embodiment of FIG. 3, a varied electrical potential difference is provided across the interface 17 at various portions of the interface. For example, the electrical potential difference applied at portion 72 using potential generator source 71, e.g., a battery, is different than the electrical potential difference applied at portion 74 using potential generator source 73. The potential generator sources 71, 73 (and the other generator sources) may be configured in a number of ways. For example, a single voltage source may be operatively connected to provide the different electrical potentials, e.g., such as with a voltage dividing network.

By applying different potential differences at different portions, the interfacial tension in those portions is also influenced differently. As such, the rate of planarization of portions of the wafer can be controlled through such varied potential differences. As shown in FIG. 3, the localized regions of charge 76 are created by application of the electrical potential difference across the interface 17 as shown by the minus signs in the wafer 14 and the plus signs in the liquid 20 in the regions 76. Although there may be leakage currents between the adjacent regions, as long as the charge density remains greater in one region than the other, such leakage currents are not problematic.

With the wettability of the liquid 20 being modified by the change in interfacial tension at the interface (i.e., wettability varies inversely with the interfacial tension), control of planarization at the various regions is attained. In such a manner, planarization problems experienced with conventional planarization can be overcome. For example, in conventional planarization processes, planarization rates tend to be greater at the periphery 16 of the wafer 14 as opposed to the central region 18 of the wafer 14. By differential control of the wettability at the center region 18 with an electrical potential difference that is different than the electrical potential difference applied at the periphery 16, such planarization rates can be controlled to be consistent along the entire interface 17. As such, the spatial control of the planarization process is accomplished providing for relief of the phenomenon referred to as the edge effect, in which the edges of the wafer are polished at a faster rate than the rest of the wafer.

It should be readily apparent that the electrical potential difference variations can be provided at any spatial location of the wafer/liquid interface 17, and the present invention is in no manner limited to differential control of planarization with respect to periphery and central portions of the wafer. For example, control of the planarization may be accomplished with respect to any location being planarized, in any desired pattern or particular area. For example, for areas on the surface of the wafer which are coated with a metal layer (i.e., metallization), the polishing could occur preferentially.

One skilled in the art will recognize that there are various configurations suitable for applying the electrical potential differences such that it is varied across the interface 17. For example, two sets of electrodes positioned on wafer holder 12 with different voltages applied thereto would create such differential electrical potentials. Further, for example, two ring-shaped electrodes, one positioned at the periphery and another towards the center may be used to set up a differential electrical potential between the periphery 16 of the wafer 14 and the center 18 of the wafer 14 to address edge effect. Various other electrode configurations such as an addressable grid of electrodes, allowing easily changeable arbitrary patterns of electrical potential differences may be used.

With an influence on the interfacial tension at the interface 17, remediation of a slip out problem can be more readily accomplished. For example, occasionally a wafer 14 will become disassociated with the wafer holder 12, and stick to the polishing pad 24. As such, it is difficult to remove the wafer 14 from the pad 24. By applying a potential difference across the interface 17, the contact angle of the liquid is changed enhancing the flow of liquid 20 in the interface between the wafer 14 and the contacting surface of the pad 24. With the influence on the interfacial tension between the liquid and the wafer 14, the wafer 14 can be more readily removed from the pad 24 as the capillary force between pad 24 and wafer 14 is reduced.

Figure 4:
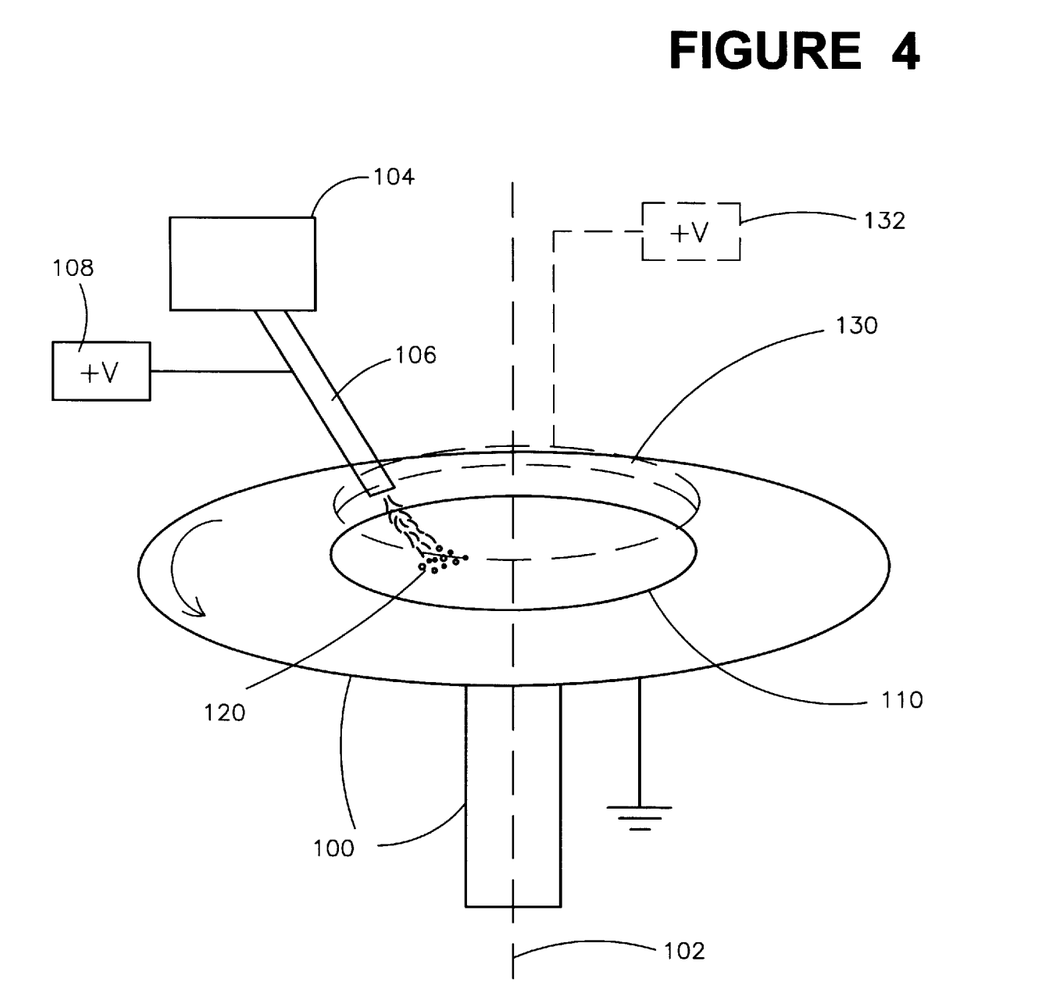
FIG. 4 is an illustrative diagram generally showing a coating apparatus in accordance with the present invention.

In addition to planarization, the present invention is also useful for other surface treatment methods, such as coating processes like spin coating, die dispense, extrusion, screen printing, and spray coating. For example, an illustrative embodiment of such use is shown in FIG. 4 with respect to the spin coating of photoresists or other polymer coatings onto the surface of the wafer. As the spin coating process is occurring, an electrical potential difference is applied across the interface between the surface of the wafer 110 and coating liquid 120. Typically, in the coating of photoresist on a substrate assembly, a vapor prime is needed (e.g., a vapor applied to the wafer to pre-wet the wafer for subsequent coating of the wafer). With the usage of the present invention, the need for such a vapor prime is reduced and potentially eliminated. The application of the electrical potential difference allows the coating material to flow smoothly and may even reduce the amount of material necessary to provide adequate coating over the surface of the wafer 110.

As shown generally in FIG. 4, in a spin coating operation the wafer 110 is supported on a rotatable coating platform 100. The coating platform 100 is rotatable about axis 102. A coating liquid 120, e.g., photoresist, is provided to the surface of the wafer 110 by a dispensing device 104. As is well known to one skilled in the art, when spinning on a coating material 120, the coating material 120 is applied on the surface of the wafer 110 to be coated and the wafer 110 is then spun such that the coating material 120 is distributed over the wafer 110 by centrifugal force. The final thickness of the layer of coating material 120 on the wafer 110 is based on, at least in part, the spin rate, the viscosity of the coating material, temperature, pressure, etc.

The spinning process can be carried out in numerous different steps. For example, the coating material 120 can be dispensed on the wafer 110 while the wafer 110 is standing still and then the speed is increased to a particular speed for distributing the material over a period of time. Any number of intermediate spinning steps could be utilized such as going from stand still to an intermediate speed for a particular period of time and then further increasing the spinning speed. It will be readily apparent that a multitude of spinning parameters are contemplated in accordance with the present invention as described in the accompanying claims. Further, the spinning process can be carried out with any number of different spin coating systems. After the material is coated on the wafer 110, the coating material 120 is processed as is known to one skilled in the art, such as curing, planarization, etc.

As described above, as the spin coating process is occurring, an electrical potential difference is applied across the interface between the surface of the wafer 110 and coating liquid 120. Such a potential difference can be accomplished in a number of manners. For example, as shown in FIG. 4, the dispensing device 104 having a nozzle 106 may be used to charge the coating material as it is dispensed to the surface of the wafer 110. With the conductive coating platform grounded, a potential difference is provided between the liquid 120 and the coating platform 100.

In an alternative configuration, as shown by the dashed line representation of FIG. 4, an electrode plate 132 may be positioned above the coating material 120 dispensed to the surface of the wafer 110. With a positive voltage source 132 connected to the electrode plate 130 and the coating platform grounded, a potential difference is provided between the plate electrode 130 and the coating platform 100 across the wafer/liquid interface. It should be readily apparent that any number of configurations for applying the potential difference across the interface may be used and that the present invention is not limited to the illustrative techniques described herein, but is only limited by the accompanying claims. Such configurations for coating include application of varying electrical potential differences as described above with respect to the planarization illustrations.

Although the invention has been described above with particular reference to various embodiments thereof, variations and modifications of the present invention can be made within a contemplated scope of the following claims.

What is claimed is:

1. A surface treatment method for use in integrated circuit fabrication, comprising the steps of:
   providing a substrate assembly having a surface;
   providing a liquid adjacent the surface resulting in an interface between the surface and the liquid;
   controlling interfacial tension at the interface between the surface and the liquid by applying an electrical potential difference across the interface such that a first layer of net charge of a first polarity forms within the substrate assembly at the interface and a second layer of net charge of a polarity opposite the first polarity forms in the liquid at the interface, wherein the formation of the first and second layers of net charge result in a change of contact angle between the surface and the liquid; and
   treating the surface as the electrical potential difference is applied across the interface.

2. The method according to claim 1, wherein the liquid is a planarization composition, and further wherein the step of treating the surface includes planarizing the substrate assembly.

3. The method according to claim 1, wherein the liquid is a coating material, and further wherein the step of treating the surface includes applying the coating material on the surface.

4. The method according to claim 3, wherein the step of applying the coating material on the surface includes spin coating the coating material on the surface.

5. The method according to claim 3, wherein the liquid is a photoresist.

6. The method according to claim 1, wherein the electrical potential difference is varied across at least a first portion of the interface relative to a second portion of the interface.

7. A planarization method for use in fabrication of integrated circuits, the method comprising the steps of:
   providing a substrate assembly supported in a holder, the substrate assembly having a surface;
   disposing the substrate assembly supported in the holder against a planarization element;
   providing a liquid planarization composition adjacent the surface resulting in an interface between the liquid planarization composition and the surface;
   controlling interfacial tension at the interface between the surface and the liquid planarization composition by applying an electrical potential difference across the interface such that a first layer of net charge of a first polarity forms within the substrate assembly at the interface and a second layer of net charge of a polarity opposite the first polarity forms in the liquid planarization composition at the interface, wherein the formation of the first and second layers of net charge result in a change of contact angle between the surface and the liquid; and
   planarizing the surface as the electrical potential difference is applied across the interface.

8. The method according to claim 7, wherein the liquid planarization composition is a planarization slurry.

9. The method according to claim 7, wherein the step of applying the electrical potential difference across the interface includes applying the electrical potential difference between the holder and the planarization element.

10. The method according to claim 7, wherein the step of applying the electrical potential difference across the interface includes applying a first voltage to the slurry as it is provided and grounding the planarization element to create the electrical potential difference across the interface.

11. The method according to claim 7, wherein the step of applying the electrical potential across the interface includes:
    applying an electrical potential difference across a first portion of the interface; and
    applying a number of other varied electrical potential differences across other portions of the interface.

12. The method according to claim 11, wherein the first portion of the interface is at a periphery of a wafer and the other portions of the interface are located centrally relative to the periphery.

13. A coating method for use in fabrication of integrated circuits, the method comprising the steps of:
    providing a substrate assembly having a surface supported on a coating platform;
    introducing a liquid coating material at the surface of the substrate assembly resulting in an interface between the surface and the liquid coating material;
    controlling interfacial tension at the interface between the surface and the liquid coating material by applying an electrical potential difference across interface; and
    coating the surface with the liquid coating material as the electrical potential difference is applied.

14. The method according to claim 13, wherein the step of coating the surface includes spin coating the liquid coating material on the surface.

15. The method according to claim 13, wherein the liquid is a photoresist.

16. The method according to claim 13, wherein the electrical potential difference is varied across at least a first portion of the interface relative to a second portion of the interface.

17. The method according to claim 13, wherein the step of applying the electrical potential difference across the interface includes applying a first voltage to the liquid coating material as it is introduced and grounding the coating platform.

18. A planarization apparatus comprising:

a planarization element;

a holder for supporting a substrate assembly having a surface, the holder being positionable for disposing the substrate assembly supported in the holder relative to the planarization element;

a dispensing device for providing a liquid planarization composition adjacent the surface resulting in an interface between the liquid planarization composition and the surface; and means for controlling interfacial tension at the interface between the liquid planarization composition and the surface, wherein the control means includes means for applying an electrical potential difference across the interface as the substrate assembly is disposed relative to the planarization element such that a first layer of net charge of a first polarity forms within the substrate at the interface and a second layer of net charge of a polarity opposite the first polarity forms in the liquid planarization composition at the interface, wherein the formation of the first and second layers of net charge results in a change of contact angle between the surface and the liquid planarization composition.

19. The apparatus according to claim 18, wherein the liquid planarization composition is a planarization slurry.

20. The apparatus according to claim 18, wherein the electrical potential difference is applied between the holder and the planarization element.

21. The apparatus according to claim 18, wherein the means for applying an electrical potential difference includes a power source for applying a first electrical potential to the liquid planarization composition as it is dispensed and grounding the planarization element.

22. The apparatus according to claim 18, wherein the means for applying an electrical potential difference includes:

means for applying an electrical potential difference across a first portion of the interface; and means for applying a number of other varied electrical potential differences across one or more other portions of the interface.

23. The apparatus according to claim 22, wherein the first portion of the interface is at the periphery of a wafer and the other portions of the interface are located more centrally relative to the periphery.

24. A coating apparatus comprising:

a rotatable coating platform for supporting a substrate assembly having a surface;

a dispensing device for introducing a liquid coating material at the surface of the substrate assembly resulting in an interface therebetween; and means for applying an electrical potential difference across the interface to control interfacial tension at the interface.

25. The apparatus according to claim 24, wherein the liquid coating material is a photoresist.

26. The apparatus according to claim 24, wherein the means for applying the electrical potential includes means for varying the electrical potential difference across at least a first portion of the interface relative to a second portion of the interface.

27. The apparatus according to claim 24, wherein the means for applying an electrical potential difference includes a voltage source for applying an electrical potential to the liquid coating material as it is provided by the dispensing device and grounding the rotatable coating platform.

* * * * *